United States Patent

Pan et al.

[11] Patent Number: 6,136,671
[45] Date of Patent: Oct. 24, 2000

[54] METHOD FOR FORMING GATE OXIDE LAYERS

[75] Inventors: Jui-Hsiang Pan, Hsinchu; Ming-Tsung Tung, Hsinchu Hsien, both of Taiwan

[73] Assignee: United Microelectronics Corp., Taiwan

[21] Appl. No.: 09/212,214

[22] Filed: Dec. 16, 1998

[51] Int. Cl.$^7$ .................. H01L 21/8238; H01L 21/8234

[52] U.S. Cl. .............................. 438/482; 438/96; 438/97; 438/283; 438/486; 438/770; 438/758; 437/56

[58] Field of Search ...................................... 438/283, 770, 438/758, 96, 97, 482, 486; 437/56

[56] References Cited

U.S. PATENT DOCUMENTS 5,989,962  11/1999  Holloway et al. ........................ 438/275
6,051,460   4/2000  Nayak et al. ............................. 438/232

*Primary Examiner*—Charles Bowers
*Assistant Examiner*—Lisa Kilday
*Attorney, Agent, or Firm*—Ratner & Prestia

[57] ABSTRACT

A method of forming gate oxide layers. A first and a second poly-silicon gates are formed over a substrate. An amorphous silicon layer is formed on the first poly-silicon gate, followed by oxidizing the amorphous silicon layer and the second poly-silicon gate. A poly-silicon layer is formed on the gate oxide layers, devices with different capacitance are formed.

9 Claims, 3 Drawing Sheets

METHOD FOR FORMING GATE OXIDE LAYERS

BACKGROUND OF THE INVENTION

1. Field of Invention

The present invention relates to the field of high-voltage devices. More particularly, the present invention relates to a method of forming gate oxide layers for high-voltage devices.

2. Description of Related Art

In an integrated circuit, high-voltage devices such as electrically programmable read-only memories (EPROM) or flash memories are often included. In general, high capacitance is often required in a high-voltage device to ensure that the device is able to operate normally despite the application of a high voltage. A method of increasing the voltage bearing capacity of a high-voltage device is to thicken the gate oxide layer of the device.

FIGS. 1A–1C are schematic, cross-sectional views showing the progression of manufacturing steps in producing gate oxide layers according to a conventional method.

First, as shown in FIG. 1A, a first poly-silicon gate 14a and a second poly-silicon gate 14b are formed over a substrate 10. Then a gate oxide layer 16a is formed on the first and the second poly-silicon gates 14a, 14b.

Next, as shown in FIG. 1B, a photoresist layer 22 is formed to cover the gate oxide layer 16a and the first silicon gate 14a. The photoresist layer 22 is formed to prevent the gate oxide layer 16a on the first silicon gate 14a from being etched during a following etching step.

In the subsequent step, as shown in FIG. 1C, the gate oxide layer 16a on the first silicon gate 14b is etched by using the photoresist layer 22 as an etching mask, and becomes a thinner gate oxide layer 16b. By removing the photoresist layer 22 and forming a poly-silicon layer (not shown) on the first and the second gate oxide layers 16a, 16b, two devices (not fully shown) with different capacitance are formed. However, the quality of the gate oxide layer 16b is deteriorated, because the etching damages the surface of the gate oxide layer 16b. Additionally, forming the thinner gate oxide layer 16b by etching does not control the thickness of the gate oxide layer 16b well enough as required.

SUMMARY OF THE INVENTION

An objective of the present invention is to provide a method of forming gate oxide layers of which the thickness can be easily controlled as specifically required.

Another objective of the present invention is to provide a method of forming gate oxide layers to prevent the gate oxide layer of the devices from being damaged during fabrication.

In accordance with the foregoing and other objectives of the present invention, a method of forming gate oxide layers is provided. A first and a second poly-silicon gates are formed over a substrate. An amorphous silicon layer is formed on the first poly-silicon gate. The amorphous silicon layer and the second poly-silicon gate are oxidized. Since the amorphous silicon layer is oxidized faster than the second poly-silicon gate, the first gate oxide layer grown from the amorphous silicon layer is thicker than the gate oxide layer grown from the second poly-silicon gate. By forming the first and the second gate oxide layers through oxidation rather than back etching, the first and the second gate oxide layers do not suffer from etching damages. Additionally, the thickness of the first gate oxide layer can be more easily controlled by adjusting the thickness of the amorphous silicon layer.

BRIEF DESCRIPTION OF DRAWINGS

The invention can be more fully understood by reading the following detailed description of the preferred embodiment, with reference made to the accompanying drawings as follows.

DESCRIPTION OF THE PREFERRED EMBODIMENTS

FIGS. 2A through 2F are cross-sectional views showing the progression of manufacturing steps in producing gate oxide layers according to a preferred embodiment of this invention.

Figure 1A:
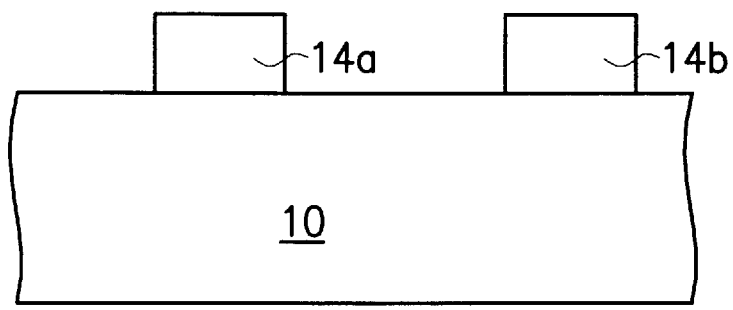
FIGS. 1A–1C are schematic, cross-sectional views of a semiconductor device schematically illustrating steps taken in a conventional fabrication process for forming gate oxide layers.
Figure 1B:
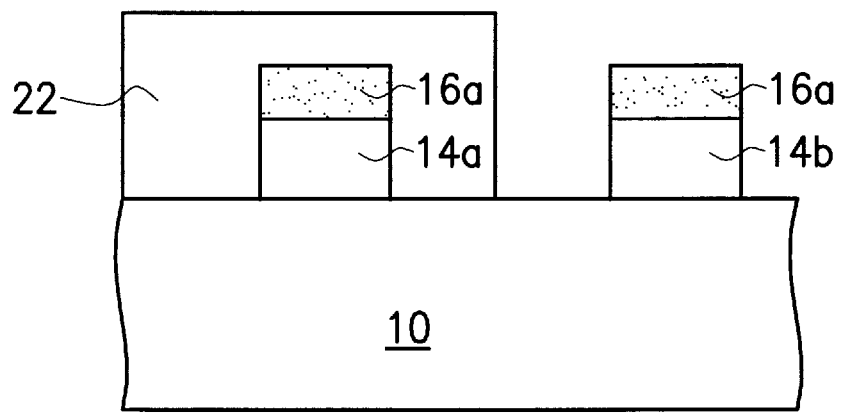
Figure 1C:
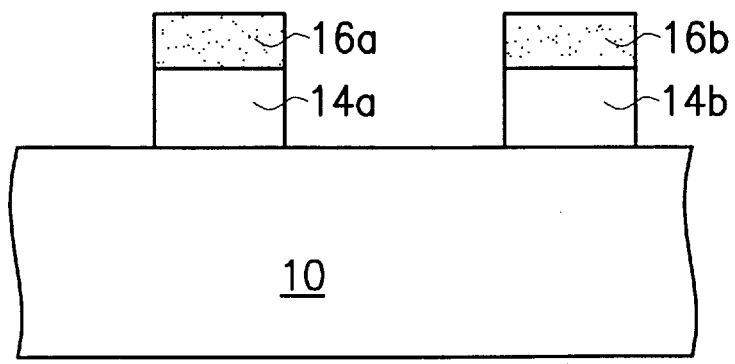
Figure 2A:
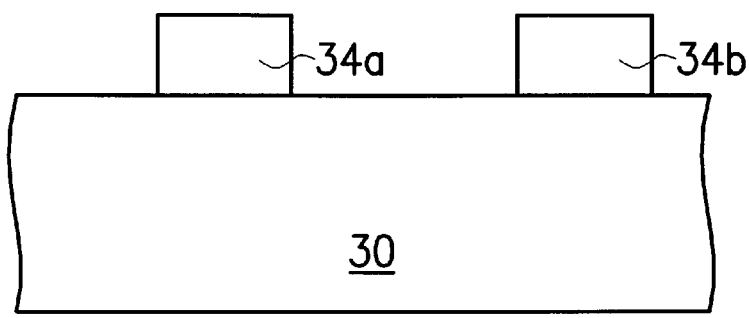
FIGS. 2A–2F are schematic, cross-sectional views of a semiconductor device schematically illustrating steps taken in a fabrication process for forming gate oxide layers, according to a preferred embodiment of the invention.

First, as shown in FIG. 2A, a first poly-silicon gate 34a and a second poly-silicon gate 34b are formed over a substrate 30. For example, the first and the second poly-silicon gates 34a, 34b are formed by low pressure chemical vapor deposition (LPCVD) at a temperature in the range of about 575° C.–650° C.

Figure 2B:
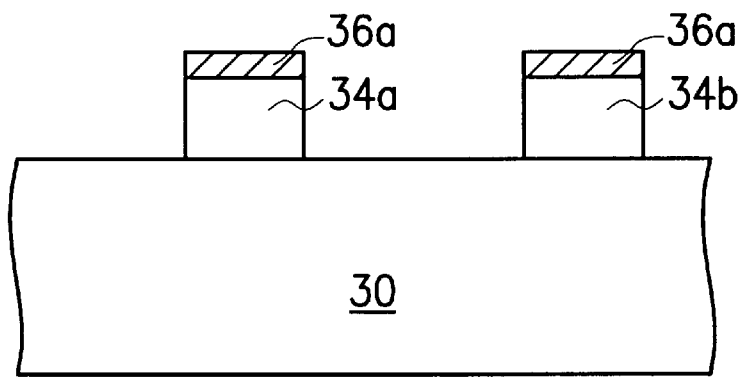

As shown in FIG. 2B, an amorphous silicon layer 36 is formed on the first and the second poly-silicon gates 34a, 34b. For example, the amorphous silicon layer 36 is formed by LPCVD at less than approximately 575° C. The thickness of the amorphous silicon layer 36 reflects electrical properties such as capacitance of subsequently formed devices.

Figure 2C:
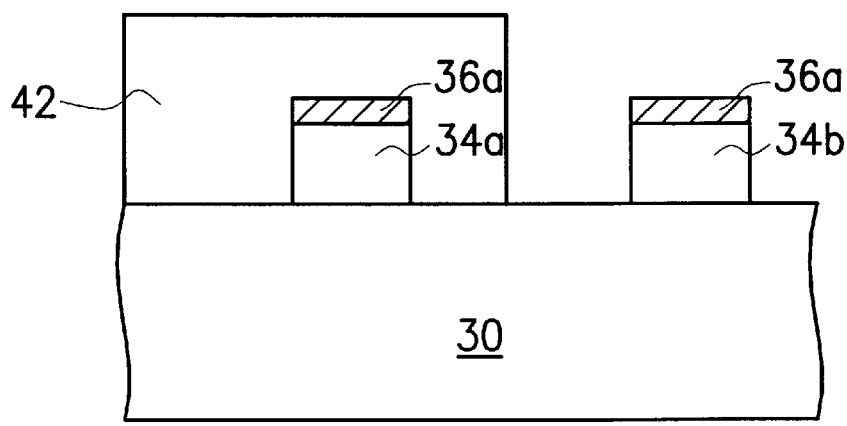

In the subsequent step, as shown in FIG. 2C, a photoresist layer 42 is formed to cover the amorphous silicon layer 36 on the first silicon gate 34a. The photoresist layer 42 is formed to prevent the amorphous silicon layer 36 on the first silicon gate 34a from being removed during a following etching step.

Figure 2D:
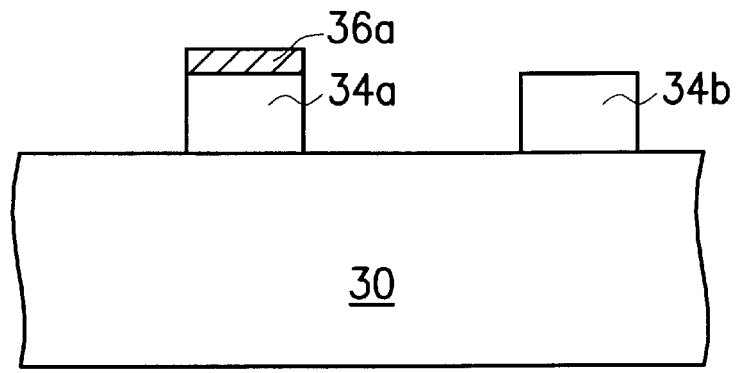

As shown in FIG. 2D, the amorphous silicon layer 36 on the second poly-silicon gate 34b is etched by using the photoresist layer 42 as an etching mask, until exposing the second poly-silicon gate 34b. The amorphous silicon layer 36 on the second poly-silicon gate 34b is etched through, for example, reactive ion etching. After etching, the photoresist layer 42 is removed.

Figure 2E:
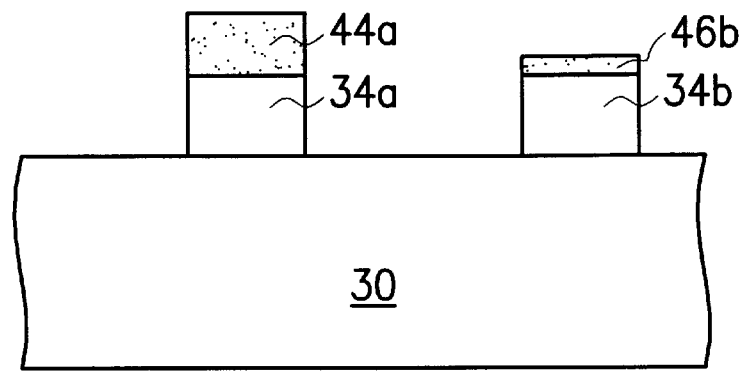

As shown in FIG. 2E, the amorphous silicon layer 36 and the second poly-silicon gate 34b are oxidized to form a first gate oxide layer 44a and a second gate oxide layer 44b. The first gate oxide layer 44a is grown from the amorphous silicon layer 36, and the second gate oxide layer 44b is grown from the second poly-silicon gate 34b. The amorphous silicon layer 36 and the second poly-silicon gate 34b are oxidized through, for example, thermal oxidation. Since the amorphous silicon layer 36 is oxidized faster than the second poly-silicon gate 34b, the first gate oxide layer 44a is thicker than the second gate oxide layer 44b.

It is to be appreciated that because the first and the second gate oxide layers 44a, 44b are formed through thermal oxidation rather than back etching the first and the second gate oxide layers 44a, 44b do not suffer from etching damages. In addition, the thickness of the first gate oxide layer 44a can be easily controlled by adjusting the thickness of the formed amorphous silicon layer 36.

Figure 2F:
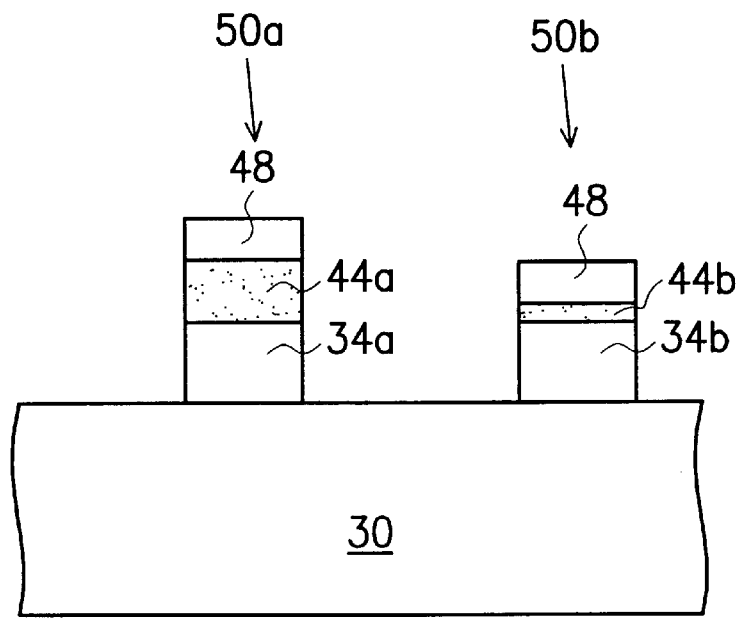

As shown in FIG. 2F, a poly-silicon layer 48 is formed on the first and the second gate oxide layers 44a, 44b to form a first and a second devices 50a, 50b. The first device 50a comprises at least the first poly-silicon gate 34a, the first gate oxide layer 44a on the first polysilicon gate 34a, and the poly-silicon layer 48 located on the first gate oxide layer 44a. The second device 50b comprises the second poly-silicon gate 34b, the second gate oxide layer 44b on the second poly-silicon gate 34b, and the poly-silicon layer 48 located on the second gate oxide layer 44b. The first device 50a has lower capacitance than the second device 50b since the first gate oxide layer 34a is thicker than the second gate oxide layer 34b. Additionally, the first and the second devices 50a, 50b with different capacitance have a great potential for use in high-voltage devices.

The processes performed after the formation of the poly-silicon layer 48 are not key points of the present invention, so they are not further described here.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming gate oxide layer, the method comprising:

providing a substrate;

forming a first and a second poly-silicon gates over the substrate;

forming an amorphous silicon layer on the first poly-silicon gate; and oxidizing the amorphous silicon layer and the second poly-silicon gate to form a first and a second gate oxide layers.

2. The method of claim 1, the step of forming the amorphous silicon layer on the first poly-silicon gate further comprising:

forming a amorphous silicon layer on the first and the second poly-silicon gates;

forming a photoresist layer to cover the amorphous silicon layer on the first silicon gate;

etching the amorphous silicon layer on the second poly-silicon gate by using the photoresist layer as an etching mask, until the second poly-silicon gate is exposed; and removing the photoresist layer.

3. The method of claim 2, wherein the amorphous silicon layer is formed at less than approximately 575° C.

4. The method of claim 2, wherein the amorphous silicon layer on the second poly-silicon gate is etched by reactive ion etching.

5. The method of claim 1, wherein the amorphous silicon layer and the second poly-silicon gate are oxidized by thermal oxidation.

6. The method of claim 1 further comprising a step of forming a poly-silicon layer on the first and the second gate oxide layers.

7. A method of forming a gate oxide layer, the method comprising:

providing a substrate having a poly-silicon gate located on the substrate;

forming an amorphous silicon layer on the poly-silicon gate; and oxidizing the amorphous silicon layer to form the gate oxide layer.

8. The method of claim 7, wherein the amorphous silicon layer is oxidized in a process including thermal oxidation.

9. The method of claim 7 further comprising a step of forming a poly-silicon layer on the gate oxide layer.

* * * * *